(12) United States Patent
Jenkins, Jr. et al.

(10) Patent No.: US 9,983,959 B2
(45) Date of Patent: May 29, 2018

(54) ERASURE CODING OF DATA WITHIN A GROUP OF STORAGE UNITS BASED ON CONNECTION CHARACTERISTICS

(71) Applicant: Microsoft Technology Licensing, LLC, Redmond, WA (US)

(72) Inventors: Robert John Jenkins, Jr., Redmond, WA (US); Parikshit S Gopalan, Palo Alto, CA (US); Cheng Huang, Redmond, WA (US); Edmund Bernard Nightingale, Redmond, WA (US); Alexander Shamis, Seattle, WA (US); Sergey Yekhanin, Mountain View, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 5 days.

(21) Appl. No.: 14/754,316

(22) Filed: Jun. 29, 2015

(65) Prior Publication Data
US 2016/0378624 A1  Dec. 29, 2016

(51) Int. Cl.
*G06F 11/10* (2006.01)
*G06F 11/20* (2006.01)
*G06F 11/16* (2006.01)
*H03M 13/15* (2006.01)

(52) U.S. Cl.
CPC ...... *G06F 11/2069* (2013.01); *G06F 11/1076* (2013.01); *G06F 11/1084* (2013.01); *G06F 11/1666* (2013.01); *H03M 13/154* (2013.01)

(58) Field of Classification Search
CPC .......................... G06F 11/1076; G06F 11/1084
See application file for complete search history.

(56) References Cited

U.S. PATENT DOCUMENTS

| | | | | |
|---|---|---|---|---|
| 5,271,012 A | * | 12/1993 | Blaum | G06F 11/1092 714/6.24 |
| 5,841,962 A | * | 11/1998 | Nakamura | G06F 11/1076 348/E5.008 |
| 8,671,407 B2 | | 3/2014 | Ballani et al. | |
| 2008/0313241 A1 | * | 12/2008 | Li | G06F 11/1076 |
| 2010/0094950 A1 | * | 4/2010 | Zuckerman | H04L 67/1008 709/213 |
| 2013/0159383 A1 | | 6/2013 | Tuliani et al. | |
| 2013/0275381 A1 | * | 10/2013 | De Schrijvr | G06F 11/1076 707/652 |
| 2013/0282976 A1 | * | 10/2013 | Dubnicki | G06F 12/00 711/112 |
| 2014/0173235 A1 | * | 6/2014 | Molaro | G06F 3/0619 711/162 |
| 2014/0310571 A1 | | 10/2014 | Fetterly et al. | |
| 2014/0380088 A1 | | 12/2014 | Bennett et al. | |
| 2014/0380126 A1 | | 12/2014 | Yekhanin et al. | |

(Continued)

*Primary Examiner* — Yolanda L Wilson
(74) *Attorney, Agent, or Firm* — Newport IP, LLC; Jacob P. Rohwer (57) ABSTRACT

The techniques and/or systems described herein implement erasure coding to generate various chunks for a data collection (e.g., data chunks and at least one encoding chunk). The chunks are then distributed and stored within an individual group (e.g., a pod) of storage units, where a pod of storage units is determined based on characteristics that affect an amount of time it takes to recover a data collection or to restore lost data.

15 Claims, 8 Drawing Sheets

(56) References Cited

U.S. PATENT DOCUMENTS

2015/0331744 A1* 11/2015 Slik ................... H04L 67/1095
    714/764
2015/0363288 A1* 12/2015 Frick ................... G06F 1/3203
    714/6.3

* cited by examiner

ERASURE CODING OF DATA WITHIN A GROUP OF STORAGE UNITS BASED ON CONNECTION CHARACTERISTICS

BACKGROUND

As the use of personal devices (e.g., smartphones, tablet devices, personal computers, etc.) becomes more prevalent, a large amount of data (e.g., photos, videos, applications or "apps", payment information, documents, social media profile/account information, etc.) useable in association with the personal devices needs to be stored. Network storage resources are often used to store the data. For instance, network storage resources may be provided by one or more data centers, which may be maintained as part of the "cloud" (e.g., cloud storage and cloud computing) accessible to personal devices via a network connection. However, network storage resources often lose data due to failure(s) (e.g., hardware failures, software failures, power failures, etc.).

SUMMARY

The techniques and/or systems described herein reliably store data so that lost data can be recovered and/or restored efficiently. For example, the techniques and/or systems implement erasure coding to generate various chunks for a data collection (e.g., data chunks and at least one encoding chunk). The chunks are then distributed and stored within an individual group (e.g., a pod) of storage units, where a pod of storage units is determined based on characteristics that affect an amount of time it takes to recover a data collection or to restore lost data.

BRIEF DESCRIPTION OF THE DRAWINGS

The detailed description is described with reference to the accompanying figures. In the figures, the left-most digit(s) of a reference number identifies the figure in which the reference number first appears. The use of the same reference number in different figures indicates similar or identical items.

DETAILED DESCRIPTION

The techniques and/or systems described herein identify a group of storage units on which to store erasure coded chunks associated with a data collection (e.g., a data block or a data file). The chunks associated with the data collection include data chunks and at least one encoding chunk. The chunks are then distributed amongst the group of storage units (e.g., one chunk per individual storage unit). As discussed herein, a group of storage units determined to store the chunks of the data collection may be referred to as a "pod" of storage units. The techniques and/or systems described herein determine which individual storage units are qualified to be part of a pod of storage units (e.g., whether a storage unit can be included in a pod) based on various characteristics that influence, or affect, an amount of time it takes a network storage system to perform restoration and/or reconstruction tasks in response to a failure.

Erasure coding divides an individual data collection (e.g., a data file or a data block) into smaller pieces, which are referred to herein as data "chunks" (the data chunks may also generally be referred to as data "fragments" or data "symbols"). Erasure coding also creates one or more "encoding" chunks to be associated with the data chunks of the data collection. For example, the encoding chunk(s) can comprise a mathematical function or an algorithm that describes a set of numbers so they can be checked for accuracy and recovered if one is lost. Consequently, the encoding chunk(s) enable the original data collection to be reconstructed (e.g., recovered) in an event one of the data chunks is lost (e.g., a storage unit on which the data chunk is stored fails).

Example characteristics that influence, or affect, an amount of time it takes a network storage system to perform restoration and/or reconstruction tasks in response to a failure include connection characteristics associated with storage units, such as: latency (e.g., between storage units or between a storage unit and a processing node restoring lost chunks or reconstructing a data file), data throughput (e.g., measured in bits per second (bps) or data packets per second (pps)), storage unit input/output operations (e.g., a period of time that delays computation due to incomplete input/output operations), or other characteristics that affect the amount of time it takes for the network storage system to retrieve and process information (i) to restore a lost chunk or (ii) to reconstruct a data collection. In another example, the characteristics can include configuration characteristics associated with storage units, such as: a common power source for storage units and/or proximity of storage units to one another (e.g., whether or not individual storage units are configured in a same geographic location, a same data center, a same section of a data center, etc.). In some instances, a connection characteristic described above can depend on a configuration characteristic.

The techniques and/or systems discussed herein store erasure coded chunks in a pod of nearby storage units that have connections with minimized latencies (e.g., little or no latency), that have higher data throughput, and that have faster input/output (I/O) operations so that a data chunk can efficiently be retrieved (e.g., read) by a device of network storage system as part of a data collection reconstruction and/or chunk restoration process. Stated another way, reading and processing data chunk(s) from storage unit(s) within an individual pod is likely to be faster than reading and processing data chunk(s) from other storage unit(s) outside the individual pod (e.g., from storage units in a different data center that is far away from a data center in which the individual pod is configured).

In various implementations, the techniques and/or systems described herein perform tests and/or monitor connections to evaluate and/or to measure the characteristics (e.g., latency, data throughput, I/O operations, etc.) associated with storage units. In some instances, the results of the tests and/or monitoring are compared to pre-defined thresholds set in accordance with tolerable levels, and storage units can be qualified to be part of a pod based at least in part on whether the results of the tests and/or monitoring satisfy the pre-defined thresholds (e.g., a measured latency is less than a pre-defined threshold of tolerable latency, a measured data throughput is greater than a pre-defined threshold of data throughput, etc.).

Accordingly, as further discussed herein, the techniques and/or systems implement erasure coding to generate various chunks for a data collection (e.g., data chunks and at least one encoding chunk). The chunks are then distributed and stored within an individual pod of storage units. As used herein, storing the chunks within an individual pod of storage units is referred to as storing an "instance" of the data collection within the individual pod of storage units. Since storage unit(s) in a pod are more likely to fail together (e.g., simultaneously), or within a period of time that is less than a recovery time, due to a common cause (e.g., a power source common to the storage units in a pod fails), the techniques and/or systems described herein are configured to store multiple (e.g., two or more) instances of the data collection respectively within multiple pods. Consequently, the techniques and/or systems reduce and/or minimize latency associated with retrieving and processing chunks within a pod, yet reliability is maintained based on storing multiple instances of the data collection. Various examples for implementing erasure encoding storage in association with pods of storage units are described herein with reference to FIGS. 1-8.

Figure 1:
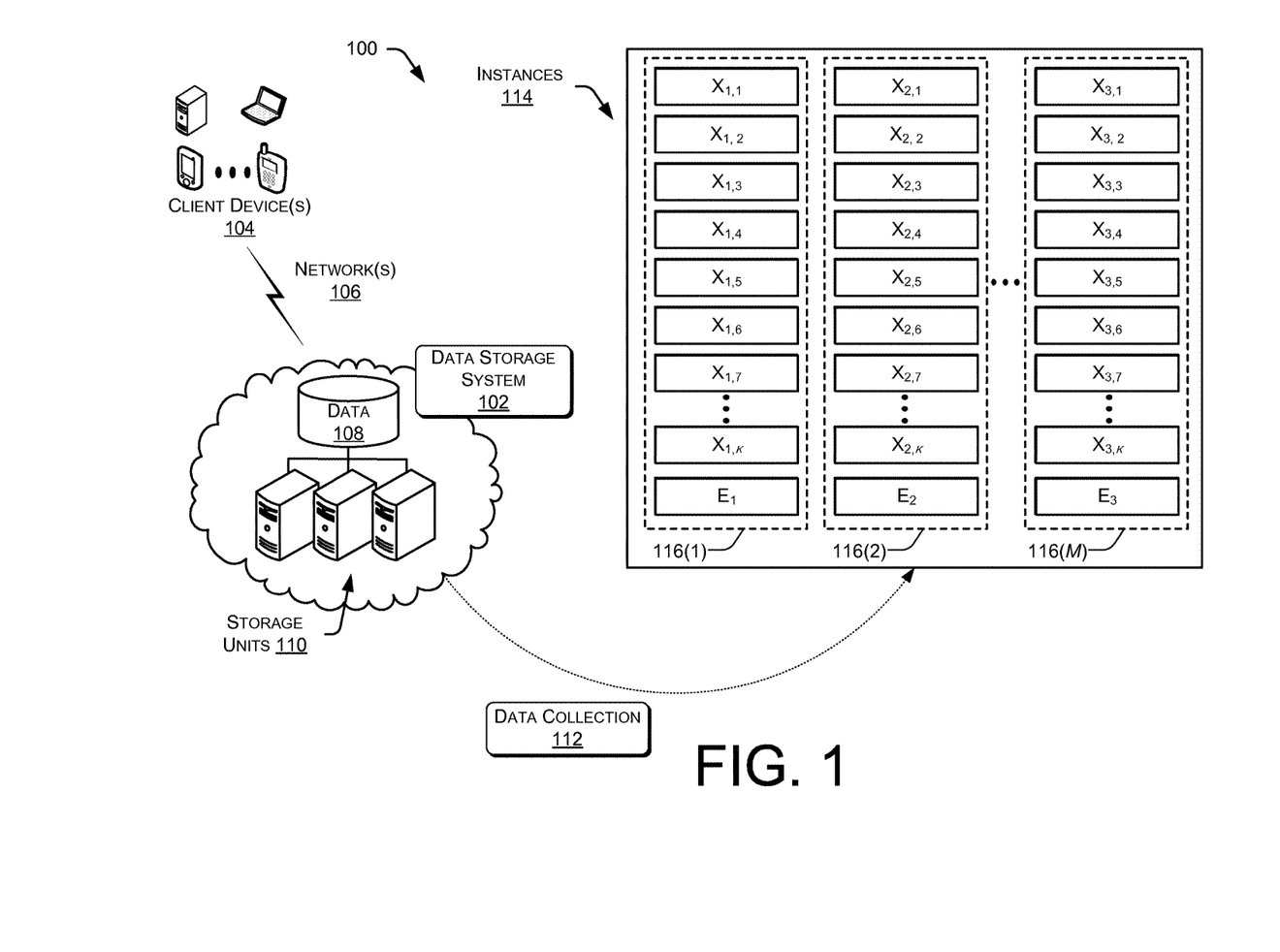
FIG. 1 illustrates an example environment that uses erasure coding and storage of chunks (e.g., data chunks and at least one encoding chunk) within a group of storage units to efficiently and reliably store data (e.g., a data collection).

FIG. 1 illustrates an example environment 100 that uses erasure coding and pods of storage units to reliably store data. The example environment 100 includes a data storage system 102, which can comprise network storage resources for various client device(s) 104 (referred to herein as a client device 104). The client device 104 can access the network storage resources via a one or more network(s) 106. A client device 104 includes any device that has network access capabilities, such as a desktop computing device, a laptop computing device, a tablet computing device, a smart phone device, a personal digital assistant (PDA), a server device, a set-top-box device, a digital video recorder (DVR) device, a game console device, a video streaming device, a personal video player device, a security camera device, a wearable device, or other wired and/or wireless communication devices.

Accordingly, the data storage system 102 is tasked with storing data 108 (e.g., large quantities of data) for the client device 104. The data storage system 102 is configured to use erasure coding to tolerate failures, and thus, the data storage system 102 can comprise: disk array systems, data grids, object stores, archival storage, and/or object-based cloud storage. The data 108 can comprise a data collection that is divisible into chunks to be stored across various storage units and to subsequently be retrieved together from the various storage units to generate or to recover the data collection. In some instances, the data 108 is referred to as a "stripe", which is a sequence of data that is logically segmented so that consecutive segments are stored on different storage units. Examples of a data collection, such as a data file, include, but are not limited to: a video, an image, a document, an application, an account profile, etc.

The network storage resources comprise a plurality of storage units 110. In various examples, the storage units 110 are configured to operate amongst a plurality of data centers or other types of network storage resources. As used herein, an individual storage unit 110 is defined as a unit that is able to fail independently due to any one of various causes. Examples of an individual storage unit 110 include: a machine (e.g., a server), a disk, a platter, or a sector. In some instances, a set of storage units is arranged into a "rack" (e.g., a row) and multiple racks of storage units can be arranged into a "grid" of storage units (e.g., configured within in a data center). In some examples, the techniques discussed herein can be implemented in association with a storage area network (SAN).

As discussed above, a pod of storage units is a group of storage units that can fail together (e.g., simultaneously) due to a common cause. For example, storage units in a pod can have a common power source, and thus, the whole pod of storage units can completely fail in response to a large failure (e.g., an event such as a power outage due to severe weather conditions). However, because individual storage units are capable of failing independently, there is still a possibility that all the storage units in a pod will not fail together. For example, an individual storage unit (e.g., a disk, a platter, or a sector) in a pod can become corrupted (e.g., a small failure), yet the other storage units in the pod are not corrupted. Accordingly, a large failure is one that causes a whole pod of storage units to fail while a small failure is one that causes a storage unit to fail independently.

As discussed above, erasure coding involves dividing, or breaking up, a data collection into k data chunks. The original k data chunks can be transformed via a mathematical function or an algorithm to incorporate one or more new encoding chunks, thereby producing N total chunks associated with the data collection. In a first example, a data collection divided into "10" data chunks (k=10) can be transformed via a mathematical function or an algorithm to incorporate "1" encoding chunk, and thus, in this example N="11". In a second example, a data collection divided into "100" data chunks (k=100) can be transformed via a mathematical function or an algorithm to incorporate "5" encoding chunks, and thus, in this example N="105". The transformation of k data chunks into N data chunks is such that the original data collection can be reconstructed from any subset of the N data chunks that has the same size as k. Stated another way, a lost chunk associated with the data collection can be recovered and restored if a sufficient number of other chunks associated with the data collection are available. Thus, referring to the first example above, if only one chunk is lost (e.g., a data chunk or the encoding chunk), then a sufficient amount of information (e.g., a sufficient number of other chunks) remains to reconstruct the data collection or to restore the lost chunk (e.g., 101−1=100, which is of the same size as the original k data chunks). Referring to the second example above, if five or less chunks are lost, then a sufficient amount of information remains to reconstruct the data collection or to restore the lost chunk (e.g., 105−5=100, which is of the same size as the original k data chunks). Consequently, erasure coding offers robust storage and backup of data because N minus k chunks can be lost without affecting the integrity of the original data collection. Moreover, a higher N to k ratio can increase the robustness of the storage (e.g., create a higher recovery rate). In various implementations, the data chunks and the encoding chunk(s) comprise internal checksums useable to detect corruption, so upon decoding, bad chunks can be identified.

Example erasure encoding techniques include: parity (e.g., XOR) encoding, Reed-Solomon coding, etc.

As shown in FIG. 1, erasure coding is used to reliably store a data collection 112 (e.g., a portion of the data 108) in the data storage system 102. The data collection 112 is stored as multiple instances 114, where an instance 114 comprises a redundant, and separate, copy of the data collection 112. An individual instance 114 of the data collection 112 is stored completely within an individual pod of storage units. For example, FIG. 1 shows that a first instance of the data collection 112 is stored within a first pod of storage units 116(1), a second instance of the data collection 112 is stored within a second pod of storage unit(s) 116(2), and a Mth instance of the data collection 112 is stored within a Mth pod of storage units 116(M) (e.g., wherein M comprises a whole number greater than or equal to two). For purposes of further discussion herein, the Mth instance of the data collection 112 stored in the Mth pod 116(M) is referred to herein as the third instance of the data collection 112 stored in the third pod (e.g., M=3). The pods 116(1) . . . 116(M) individually comprise a same number of storage units or a different number of storage units, e.g., depending on the characteristics described above.

A pod is a group of storage units that will likely fail together (e.g., due to a power outage because all the storage units are powered by a same source). Moreover, a pod is a group of storage units that operates together efficiently. Stated another way, storage units that have "strong" connection characteristics can be part of a same pod. The strength of a connection characteristic can depend on a measured or monitored amount, and can further depend on a comparison of the measured or monitored amount to a pre-defined threshold. For example, a connection with no latency or a limited amount of latency (e.g., less than a pre-defined threshold of latency) and/or a large amount of data throughput (e.g., greater than a pre-defined threshold of data throughput) can be considered a connection strong enough to cause a storage unit to be included in a pod. In various examples, configuration characteristics, such as a common power source for storage units can be related to the strength of a network connection between the storage units. Thus, recovering a data collection or restoring a lost chunk via erasure coding by retrieving and/or processing available chunks stored on storage units within an individual pod is faster compared to recovering the data collection or restoring the lost chunk via erasure coding by retrieving and/or processing chunks stored on storage units outside the pod (e.g., due to the differences in a strength of connections within a pod compared to a strength of connections outside the pod). To this end, an instance of erasure coded chunks is completely stored within a pod of storage units (e.g., nearby storage units) instead of storing the erasure coded chunks in storage units that are spread far apart (e.g., in different data centers).

As shown in FIG. 1, the first pod of storage units 116(1), the second pod of storage units 116(2), and the third pod of storage units 116(M) (e.g., M=3), include k data chunks (where k is a whole number). For instance, the first pod of storage units 116(1) comprises: a first data chunk ($X_{1,1}$), a second data chunk ($X_{1,2}$), a third data chunk ($X_{1,3}$), a fourth data chunk ($X_{1,4}$), a fifth data chunk ($X_{1,5}$), a sixth data chunk ($X_{1,6}$), a seventh data chunk ($X_{1,7}$), a kth data chunk ($X_{1,k}$), as well as an encoding chunk ($E_1$). Similarly, the second pod of storage units 116(2) comprises: a first data chunk ($X_{2,1}$), a second data chunk ($X_{2,2}$), a third data chunk ($X_{2,3}$), a fourth data chunk ($X_{2,4}$), a fifth data chunk ($X_{2,5}$), a sixth data chunk ($X_{2,6}$), a seventh data chunk ($X_{2,7}$), a kth data chunk ($X_{2,k}$), as well as an encoding chunk ($E_2$). And, the third pod of storage units 116(M) (e.g., M=3) comprises: a first data chunk ($X_{3,1}$), a second data chunk ($X_{3,2}$), a third data chunk ($X_{3,3}$), a fourth data chunk ($X_{3,4}$), a fifth data chunk ($X_{3,5}$), a sixth data chunk ($X_{3,6}$), a seventh data chunk ($X_{3,7}$), a kth data chunk ($X_{3,k}$), as well as an encoding chunk ($E_3$). In various implementations, an individual chunk within an individual instance is stored on a different storage unit within a pod.

In various implementations, the data collection 112 is divided into k original data chunks in the same way across the various instances. Thus, the first data chunk ($X_{1,1}$) of the first pod of storage units 116(1) is the same as the first data chunk ($X_{2,1}$) of the second pod of storage units 116(2) and the first data chunk ($X_{3,1}$) of the third pod of storage units 116(M) (e.g., M=3), for example. The data storage system 102 can use indexes to organize and/or locate individual storage units and/or data chunks stored on the individual storage units.

In various implementations, the encoding chunks associated with different instances are computed to be different. That is, encoding chunk ($E_1$) is different than encoding chunk ($E_2$) and encoding chunk ($E_3$). Moreover, encoding chunk ($E_2$) is different than encoding chunk ($E_3$). This improves reliability and reduces the possibility of data loss by creating more failure recovery options. As an example, the encoding chunks can comprise parity checks implemented in association with XOR erasure encoding. While the encoding chunks (e.g., parity checks) can be different, the different encoding chunks are created based on known dependencies such that if one of the encoding chunks is lost (e.g., $E_1$ is lost due to a failure of a storage unit on which it is stored), then the lost encoding chunk can be recovered based on the known dependencies with other encoding chunk(s) (e.g., $E_2$ and $E_3$), as further discussed herein with respect to the example Equations. In alternative implementations, the encoding chunks can be the same, such that $E_1=E_2=E_3$.

Figure 2:
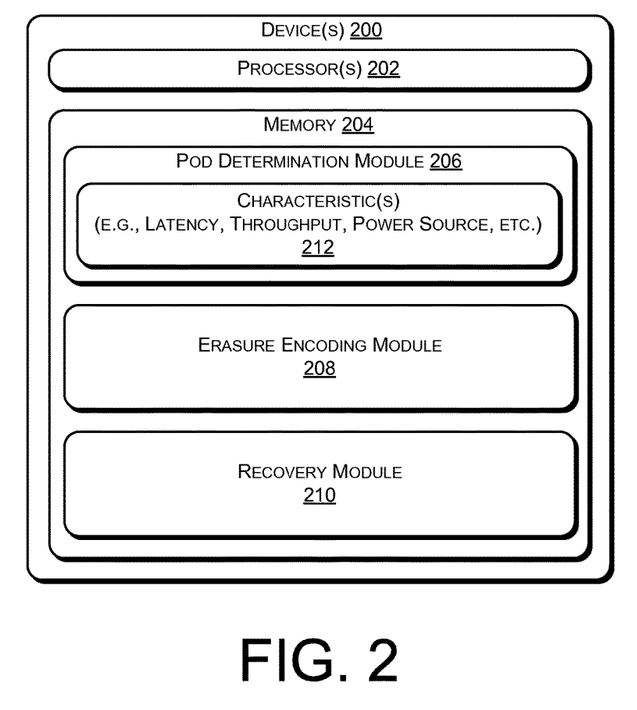
FIG. 2 illustrates example components of a device useable to erasure code a data collection (e.g., a data block or a data file), to store the chunks of the data collection within the group of storage units, to process (e.g., read) the chunks from within the group of storage units, to restore lost chunks, and/or to reconstruct the data collection using the stored chunks.

FIG. 2 illustrates example components of a device(s) 200 (referred to herein as a device 200) useable to store the erasure coded chunks within a group of storage units, to restore a lost chunk, and/or to recover a data collection using the stored erasure coded chunks. The device 200 can be part of the data storage system 102 (e.g., a data center), and thus, the device can be a server, a computer, or another device connected to the storage unit(s) 110 and configured to manage the storage of data 108. In one example, the device 200 comprises a metadata server that is responsible for indexing operations in one or more data centers. In some instances, an individual device 200 can be included within a pod of storage units, or can be part of a storage unit (e.g., a processing node of a storage unit), so that chunks can be retrieved and processed more efficiently (e.g., using strong connections) during a collection reconstruction process or a chunk restoration process.

The device 200 can include one or more processor(s) 202 and memory 204. The processor(s) 202 can be a single processing unit or a number of units, each of which could include multiple different processing units. The processor(s) 202 can include a microprocessor, a microcomputer, a microcontroller, a digital signal processor, a central processing unit (CPU), a graphics processing unit (GPU), etc. Alternatively, or in addition, some or all of the techniques described herein can be performed, at least in part, by one or more hardware logic components. For example, and without limitation, illustrative types of hardware logic components that can be used include a Field-Programmable Gate Array (FPGA), an Application-Specific Integrated Circuit (ASIC), an Application-Specific Standard Products (ASSP), a state machine, a Complex Programmable Logic Device (CPLD), other logic circuitry, a system on chip (SoC), and/or any other devices that perform operations based on instructions. Among other capabilities, the processor(s) 202 can be configured to fetch and execute computer-readable instructions stored in the memory 204.

The memory 204 can include one or a combination of computer-readable media. As used herein, "computer-readable media" includes computer storage media and communication media.

Computer storage media includes volatile and non-volatile, removable and non-removable media implemented in any method or technology for storage of information, such as computer-readable instructions, data structures, program modules, or other data. Computer storage media includes, but is not limited to, phase change memory (PRAM), static random-access memory (SRAM), dynamic random-access memory (DRAM), other types of random access memory (RAM), read only memory (ROM), electrically erasable programmable ROM (EEPROM), flash memory or other memory technology, compact disk ROM (CD-ROM), digital versatile disks (DVD) or other optical storage, magnetic cassettes, magnetic tape, magnetic disk storage or other magnetic storage devices, or any other medium that can be used to store information for access by a computing device.

In contrast, communication media includes computer-readable instructions, data structures, program modules, or other data in a modulated data signal, such as a carrier wave. As defined herein, computer storage media does not include communication media.

The memory 204 can include an operating system configured to manage hardware and services within and coupled to the device 200 for the benefit of other components and other devices. Moreover, the memory 204 can include a pod determination module 206, an erasure encoding module 208, and a recovery module 210. As used herein, the term "module" is intended to represent example divisions of executable instructions for purposes of discussion, and is not intended to represent any type of requirement or required method, manner or organization. Accordingly, while various "modules" are discussed, their functionality and/or similar functionality could be arranged differently (e.g., combined into a fewer number of modules, broken into a larger number of modules, etc.). Further, while certain functions and modules are described herein as being implemented by software and/or firmware executable on a processor, in other embodiments, any or all of the modules can be implemented in whole or in part by hardware (e.g., a specialized processing unit, etc.) to execute the described functions. In various implementations, the modules described herein in association with device 200 can be executed across multiple devices that comprise the data storage system 102.

The pod determination module 206 is configured to split up storage units into pods of storage units (e.g., pods 116(1) . . . 116(M)). As discussed above, the storage units can be configured across multiple different data centers built in different geographic locations. The pod determination module 206 identifies storage units to include in a pod based on characteristics 212. For instance, the characteristics 212 can include connection characteristics associated with storage units, such as: latency (e.g., between storage units or between a storage unit and a device 200 configured to restore lost chunks or to reconstruct a data collection), data throughput, storage unit input/output operations, or other characteristics that affect the amount of time it takes for the network storage system 102 to retrieve and process information (i) to restore a lost chunk and/or (ii) to reconstruct a data collection. The characteristics 212 can additionally or alternatively include configuration characteristics associated with storage units, such as a common power source for storage units and/or physical proximity of storage units to one another. In some instances, a connection characteristic depends on, or relates to, a configuration characteristic. Consequently, the pod determination module 206 is tasked with determining groups of storage units in which an amount of time it takes (i) to restore a lost chunk and/or (ii) to reconstruct a data collection is minimized.

In various implementations, the pod determination module 206 is configured to monitor connections to determine the characteristics 212 and/or implement tests to measure the characteristics 212. The pod determination module 206 can compare results of the tests and/or monitored characteristic values to pre-defined thresholds, and storage units can be qualified to be part of a pod based on whether the results of the tests and/or the monitored characteristic values satisfy the pre-defined thresholds.

In various implementations, the pod determination module 206 can access configuration specifications associated with an arrangement of the storage units (e.g., within a data center) to determine the characteristics 212. For instance, the pod determination module 206 can identify which storage units are powered by a common power source.

In a specific example where the storage units 110 comprise machines (e.g., servers), the pod determination module 206 creates pods such that reads across machines within a pod are as fast as reads within an individual machine.

The erasure encoding module 208 is configured to encode and store data (e.g., data collection 112) in the storage units 110. In various examples, the erasure encoding module 208 is configured to determine a number of instances (e.g., copies) of a data collection to be stored and to divide the data collection into erasure coded data chunks to be stored for each instance. The erasure encoding module 208 can also generate one or more encoding chunk(s) to be associated with the data chunks. Then, the erasure encoding module 208 stores the data chunks and the one or more encoding chunk(s) within a pod of storage units.

In various implementations, the erasure encoding module 208 uses various factors to determine a number of chunks and/or a number of storage units, e.g., within an identified pod of storage units, useable to store the chunks. These factors can include a size of a data collection. For example, a large data file (e.g., a 256 gigabyte file) can be divided into more data chunks compared to a smaller data file (e.g., a 64 gigabyte file). Therefore, a greater number of storage units are utilized for a larger file compared to a smaller file. Further, the number of chunks and/or the number of storage units used to store the chunks can also depend on an amount of storage capacity of an individual storage unit. For instance, erasure coding can divide a data collection into data chunks of an equal size, and thus, a storage unit with a lower storage capacity can limit a size of each data chunk, which can in turn determine the number of chunks and/or the number of storage units used for erasure coding of a data collection.

In some instances, a pod includes a number of storage units that is greater than a number of chunks to be stored. Stated another way, the number of chunks associated with a data collection can be determined independent of a number of storage units in a pod. Alternatively, in various examples, the erasure encoding module 208 can erasure encode a data collection into a number of chunks that is equal to a number of storage units in at least one pod.

The erasure encoding module 208 can be configured to select between storing two instance of a data collection or three instances of the data collection. Of course, the erasure encoding module 208 can also store a single instance of the data collection or more than three instances of the data collection, as well. Storing a larger number of instances (e.g., three instances) increases reliability because the stored data is recoverable in response to a greater number of failure scenarios (e.g., various combinations of failures where the failure locations are determined via the indexes). However, storing a smaller number of instances (e.g., two instances) reduces the amount of storage capacity required to store the data collection. Thus, the erasure encoding module 208 is configured to consider various factors when determining a number of instances to store. For example, the factors can include user input (e.g., a user has signed up and paid for more reliable storage) and/or a type of information (e.g., important information that requires more reliable storage).

The recovery module 210 is configured to detect at least one failed storage unit in one of the instances of the data collection stored. An instance of the data collection with a failed storage unit is referred to as a compromised instance due to loss of data and/or corrupted data (e.g., a data chunk or an encoding chunk) stored by the failed storage unit. The recovery module 210 can manage the failures using the indexes assigned to the chunks and corresponding storage units. In response to detecting a failure of a storage unit, the recovery module is configured to reconstruct a data collection and/or to restore the lost chunk(s).

In various implementations, the recovery module 210 determines whether to reconstruct the data collection and/or to restore the lost chunks from within a pod that contains a failed storage unit or from outside the pod (e.g., another pod) that contains the failed storage unit. As discussed above, chunks associated with a data collection are initially stored within in a pod so that the data collection can be reconstructed, or a lost chunk can be restored, more efficiently due to the strong connection characteristics (e.g., little or no latency, higher data throughput, faster I/O operations, etc.). Accordingly, depending on a number of failed storage units and/or locations (e.g., as identified by the indexes) of the failed storage units, the recovery module 210 determines whether to use connections within a pod to recover a compromised instance or to use connections outside the pod to recover a compromised instance. In various implementations, the recovery module 210 prioritizes the use of connections within the pod if recovery from within the pod is possible. Examples are provided herein with respect to FIGS. 3-7.

Figure 3:
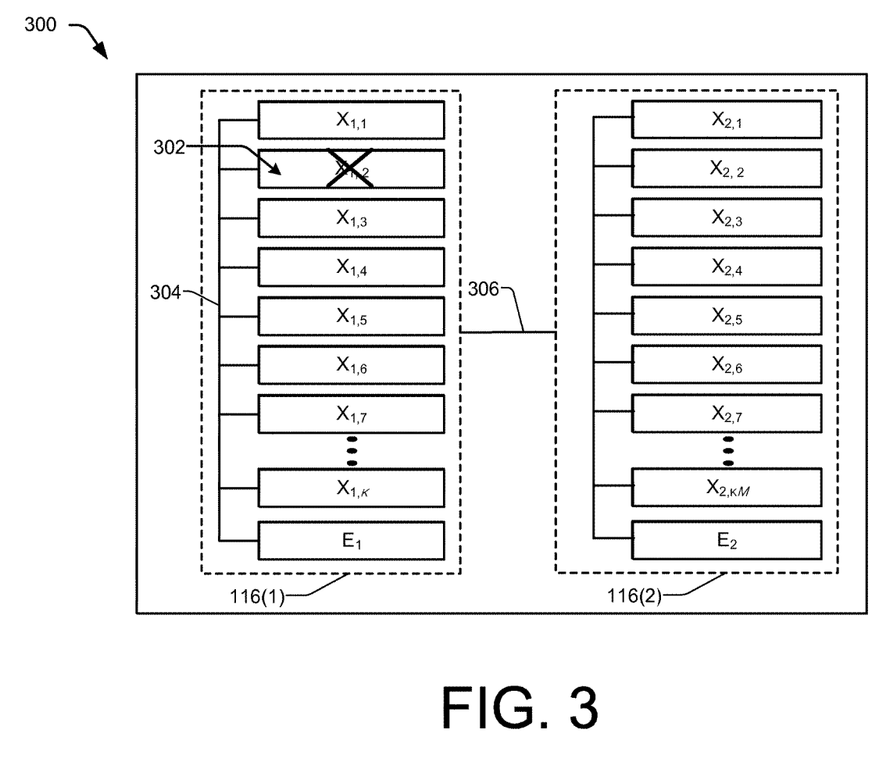
FIG. 3 illustrates an example diagram that determines whether connections within a group of storage units or connections outside the group of storage units are to be used to restore a lost chunk and/or to reconstruct a data collection, in response to a detected failure of a single storage unit that stores a data chunk.

FIG. 3 illustrates an example diagram 300 in which the recovery module 210 determines whether to use connections within a pod of storage units or connections outside the pod of storage units to restore a lost chunk and/or to reconstruct a data collection, in response to a detected failure of a single storage unit that stores a data chunk. The example diagram 300 shows two pods (e.g., pod 116(1) and pod 116(2)). In one example, the erasure encoding module 208 may have only stored two instances of the data collection (e.g., data collection 112), e.g., in pod 116(1) and 116(2). In another example, the erasure encoding module 208 may have stored three instances of the data collection, but the third pod (e.g., pod 116(M)) may have been completely lost due to a large failure, such as a power outage (e.g., all the storage units in the third pod 116(M) failed together).

The example diagram 300 illustrates a failure 302 of a single storage unit storing a data chunk, the failure at data chunk with an index of $X_{1,2}$ (e.g., as represented by the "X"). Accordingly, the instance of the data collection stored within pod 116(1) is compromised due to the failure 302. As discussed above, the connections 304 between the storage units within the first pod 116(1) (e.g., $X_{1,1}$, $X_{1,2}$, $X_{1,3}$, $X_{1,4}$, $X_{1,5}$, $X_{1,6}$, $X_{1,7}$, $X_{1,k}$, $E_1$) that is compromised are stronger than the connections 306 that would have to be used to retrieve or read data from storage units that are outside the first pod 116(1), e.g., the storage units of the second pod 116(2) (e.g., $X_{2,1}$, $X_{2,2}$, $X_{2,3}$, $X_{2,4}$, $X_{2,5}$, $X_{2,6}$, $X_{2,7}$, $X_{2,k}$, $E_2$). The connections 304 are stronger than the connections 306 due to minimized latency, greater data throughput, faster I/O operations, etc.

Therefore, the recovery module 210 can initially determine a number of failure(s) (e.g., one failure 302) and a location (e.g., index) of the failure(s). Then, based on the number of failure(s) and the location of the failure(s), the recovery module 210 determines if the comprised instance of the data collection, e.g., stored in pod 116(1), includes a sufficient amount of information (e.g., a sufficient number of other available chunks) so that the compromised instance can be recovered from within the pod using connections 304. In the case of FIG. 3, XOR encoding can be used, and thus, the example diagram 300 illustrates one encoding chunk per instance of the data collection (e.g., $E_1$ or $E_2$). Referring to the instance of the data collection stored in pod 116(1), k=8 and N=9 (e.g., "8" data chunks plus "1" encoding chunk). With only one failure 302, the recovery module 210 determines that there is a sufficient amount of information available within the pod and that it has the ability to restore the lost data chunk $X_{1,2}$ using connections 304, and without using connections 306. For instance, using XOR encoding, $E_1$ can be generated to be a linear combination of data chunks $X_{1,1}$-$X_{1,k}$ and thus, data chunk $X_{1,2}$ can be restored using the encoding chunk, $E_1$.

Figure 4:
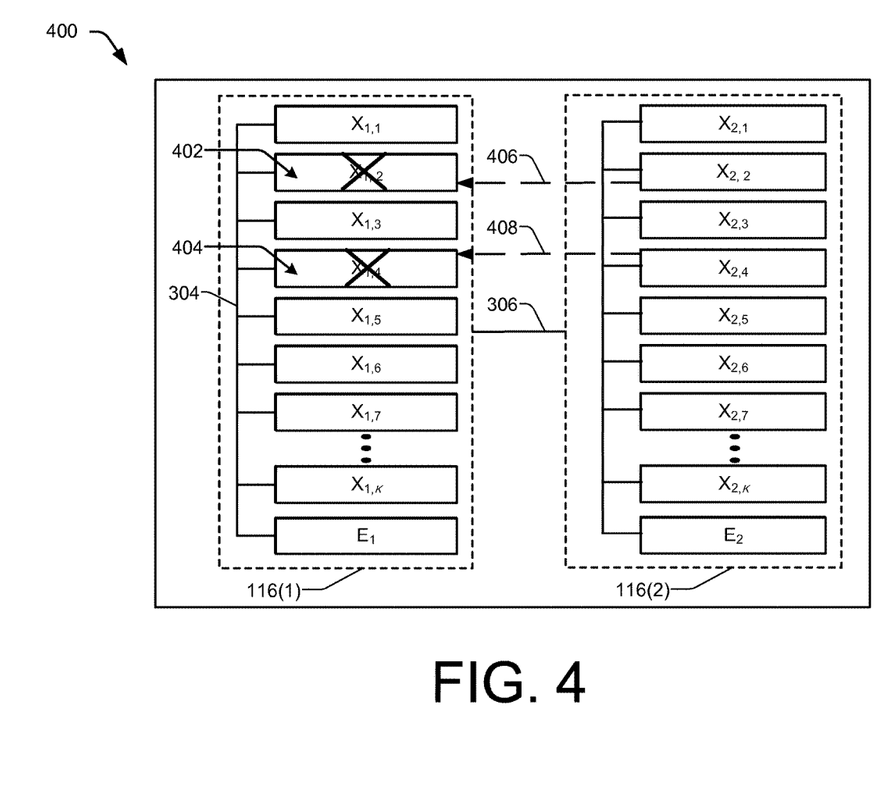
FIG. 4 illustrates another example diagram that determines whether connections within a group of storage units or connections outside the group of storage units are to be used to restore lost chunks and/or to reconstruct a data collection, in response to detected failures of two storage units that individually store a data chunk.

FIG. 4 illustrates an example diagram 400 in which the recovery module 210 determines whether to use connections within a pod of storage units or connections outside the pod of storage units to restore a lost chunk and/or to reconstruct a data collection, in response to detected failures of two storage units that individually store a data chunk. Similar to FIG. 3, the example diagram 400 shows two pods (e.g., pod 116(1) and pod 116(2)). Again, the erasure encoding module 208 may have only stored two instances of the data collection (e.g., data collection 112), e.g., in pod 116(1) and 116(2). Or, the erasure encoding module 208 may have stored three instances of the data collection, but the third pod (e.g., pod 116(M)) may have been completely lost due to a large failure, such as a power outage (e.g., all the storage units in the third pod 116(M) failed together).

The example diagram 400 illustrates a first failure 402 and a second failure 404 of storage units individually storing a data chunk, the first failure 402 at data chunk with an index of $X_{1,2}$ and the second failure 404 at data chunk with an index of $X_{1,4}$ (e.g., as represented by the "X"s). Accordingly, the instance of the data collection stored within pod 116(1) is compromised due to the first failure 402 and the second failure 404.

With respect to the example diagram 400, the recovery module 210 can initially determine a number of failures (e.g., two failures 402 and 404) and a location (e.g., indexes) of the failures. Then, based on the number of failures and the location of the failures, the recovery module 210 determines if the comprised instance of the data collection, e.g., stored in pod 116(1), can be recovered from within the pod using connections 304. Again, in the case of FIG. 4, XOR encoding is used, and thus, the example diagram 400 illustrates one encoding chunk per instance of the data collection (e.g., $E_1$ or $E_2$). Referring to the instance of the data collection stored in pod 116(1), k=8 and N=9 (e.g., "8" data chunks plus "1" encoding chunk).

Here, with two simultaneous failures 402 and 404, the recovery module 210 can determine that there is not a sufficient amount of information available within the pod and that it does not have the ability to restore the lost data chunks $X_{1,2}$ and $X_{1,4}$ using only connections 304. Therefore, in the example diagram 400, the recovery module 210 recovers the compromised instance of the data collection by using connections 306 outside the pod 116(1) (e.g., using cross-pod network communications). In one example, the recovery module 210 can copy both (i) the data chunk from $X_{2,2}$ to $X_{1,2}$ using connections 306 as referenced by 406 and (ii) the data chunk from $X_{2,4}$ to $X_{1,4}$ using connections 306 as referenced by 408. In another example, the recovery module 210 can copy one of (i) the data chunk from $X_{2,2}$ to $X_{1,2}$ using connections 306 as referenced by 406 or (ii) the data chunk from $X_{2,4}$ to $X_{1,4}$ using connections 306 as referenced by 408, and then the recovery module 210 can determine that there is a sufficient amount of information available within the pod to restore the other lost data chunk (e.g., $X_{1,4}$) using connections 304 due to the copied data chunk (e.g., $X_{1,2}$).

Figure 5:
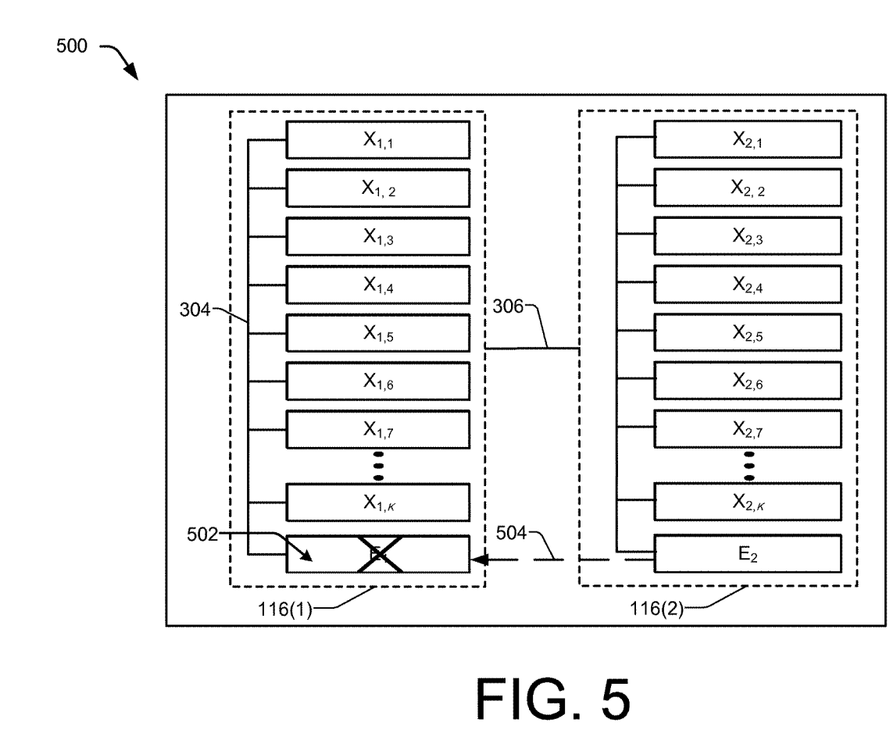
FIG. 5 illustrates another example diagram that determines whether connections within a group of storage units or connections outside the group of storage units are to be used to restore a lost chunk and/or to reconstruct a data collection, in response to a detected failure of a single storage unit that stores an encoding chunk.

FIG. 5 illustrates an example diagram 500 in which the recovery module 210 determines whether to use connections within a pod of storage units or connections outside the pod of storage units to restore a lost chunk and/or to reconstruct a data collection, in response to a detected failure of a single storage unit that stores an encoding chunk. Similar to FIGS. 3 and 4, the example diagram 500 shows two pods (e.g., pod 116(1) and pod 116(2)). Again, the erasure encoding module 208 may have only stored two instances of the data collection (e.g., data collection 112), e.g., in pod 116(1) and pod 116(2). Or, the erasure encoding module 208 may have stored three instances of the data collection, but the third pod (e.g., pod 116(M)) may have been completely lost due to a large failure, such as a power outage (e.g., all the storage units in the third pod 116(M) failed together).

The example diagram 500 illustrates a single failure 502 of a storage unit that stores an encoding chunk, the single failure 502 at index $E_1$ (e.g., as represented by the "X"). Accordingly, the instance of the data collection stored within pod 116(1) is compromised due to the failure 502.

With respect to the example diagram 500, the recovery module 210 can initially determine a number of failure(s) (e.g., a single failure 502) and location(s) (e.g., indexes) of the failure(s). Then, based on the number of failure(s) and the location of the failure(s), the recovery module 210 determines if the comprised instance of the data collection, e.g., stored in pod 116(1), can be recovered from within the pod using connections 304.

In the case of FIG. 5, XOR encoding is used, and thus, the example diagram 500 illustrates one encoding chunk per instance of the data collection (e.g., $E_1$ or $E_2$). Referring to the instance of the data collection stored in pod 116(1), k=8 and N=9 (e.g., "8" data chunks plus "1" encoding chunk). Therefore, the recovery module 210 can restore the lost encoding chunk, $E_1$, via a first option where the data chunks $X_{1,1}$ through $X_{2,k}$ are read using the connections 304 within the pod and $E_1$ is re-computed based on sufficient information within the pod (e.g., $E_1$ can be a linear combination of chunks $X_{1,1}$-$X_{1,k}$). However, the recovery module 210 can alternatively restore the lost encoding chunk, $E_1$, via a second option where encoding chunk $E_2$ is retrieved from pod 116(2) using connections 306, as referenced by 504. Because the erasure encoding module 208 generates $E_1$ and $E_2$ (e.g., as well as $E_3$ from FIG. 1) using known dependencies, $E_2$ can include sufficient information to re-compute $E_1$. This is further discussed herein with respect to the example Equations. In various implementations, the recovery module 210 can be configured to select between the first option and the second option based on cost factors associated with reading available data chunks within a pod using connections 304 (e.g., the eight data chunks in pod 116(1)) compared to reading a single data chunk from outside the pod (e.g., a single encoding chunk $E_2$) using connections 306.

Figure 6:
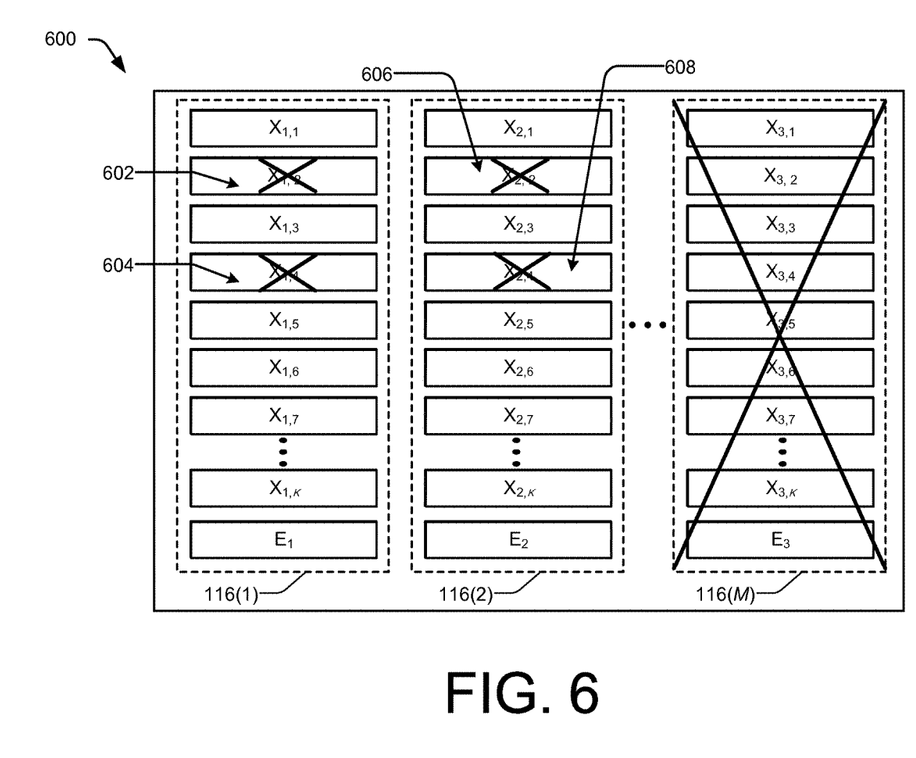
FIG. 6 illustrates another example diagram that determines that connections outside a group of storage units are to be used to restore lost chunks and/or to reconstruct a data collection, in response to detected failures of storage units that store the same two data chunks.

FIG. 6 illustrates an example diagram 600 in which the recovery module 210 determines that connections outside a pod of storage units are to be used to restore lost chunks and/or to reconstruct a data collection, in response to detected failures of storage units, distributed across multiple instances, that store the same two data chunks. The example diagram 600 shows that the erasure encoding module 208 stored three instances of a data collection (e.g., data collection 112), e.g., in pod 116(1), pod 116(2), and pod 116(M) (e.g., M=3). As illustrated, all the storage units in the third pod 116(M) may have been completely lost due to a large failure, such as a power outage (e.g., represented by the large "X" through the third pod 116(M)). Furthermore, the example diagram 600 shows that the storage units storing the same two corresponding data chunks of the data collection in each of the first pod 116(1) and the second pod 116(2) have failed (e.g., simultaneous failure). That is, for pod 116(1), data chunk $X_{1,2}$ is lost (as referenced by 602) and data chunk $X_{1,4}$ is lost (as referenced by 604). Moreover, for pod 116(2), data chunk $X_{2,2}$ is lost (as referenced by 606) and data chunk $X_{2,4}$ is lost (as referenced by 608).

In response to detecting the failures in example diagram 600, the recovery module 210 is able to restore the compromised instances of the data collection (e.g., stored in each of pod 116(1) and pod 116(2), as well as pod 116(M)), using cross-pod connections, due to the known dependencies between $E_1$ and $E_2$.

The following discussion describes the known dependencies between encoding chunks (e.g., encoding chunks that are different but generated based on the known dependencies). In the following example, F comprises a finite field of characteristic two, and thus, −1=1. Furthermore, in this example, it can be assumed that F has more than eleven ("11") elements, and all coefficients $\{\alpha_j\}_{1 \le j \le 8}$ and $\{\beta_i\}_{1 \le i \le 3}$ (that are used to combine data chunks $\{x_j\}_{1 \le j \le 8}$) are distinct. Accordingly, the code can be represented by the following "grid" shown in TABLE 1, where x is a data chunk, P is a parity check (e.g., an encoding chunk), and each column is an erasure coded instance of a data collection.

TABLE 1

| $x_1$ | $x_1$ | $x_1$ |
|---|---|---|
| $x_2$ | $x_2$ | $x_2$ |
| $x_3$ | $x_3$ | $x_3$ |
| $x_4$ | $x_4$ | $x_4$ |
| $x_5$ | $x_5$ | $x_5$ |
| $x_6$ | $x_6$ | $x_6$ |
| $x_7$ | $x_7$ | $x_7$ |
| $x_8$ | $x_8$ | $x_8$ |
| $P_1$ | $P_2$ | $P_3$ |

The parity check, $\{P_i\}$, can be defined as follows:

$$P_i = \Sigma_{j=1}^{8}(\alpha_j + \beta_i) x_j \quad \text{Equation (1)}$$

The following discussion shows why there is no data loss even if a complete column (e.g., a whole pod such as pod 116(M) in FIG. 6) is lost and additionally any two data rows (e.g., the same two corresponding data chunks that are lost in FIG. 6). The remaining two columns are s and t and the missing data rows are i and j. The remaining encoding chunks provide two constraints on variables $x_i$ and $x_j$. Coefficients of these constraints are given by a matrix whose determinant is:

$$\begin{vmatrix} \alpha_i + \beta_s & \alpha_j + \beta_s \\ \alpha_i + \beta_t & \alpha_j + \beta_t \end{vmatrix} = (\alpha_i + \alpha_j)(\beta_s + \beta_t) \neq 0 \quad \text{Equation (2)}$$

The parity check structure provides the following example code properties:

$$P_i = \Sigma_{j=1}^{8}(\alpha_j + \beta_i) x_j = \Sigma_{j=1}^{8} \alpha_j x_j + \beta_L(\Sigma_{j=1}^{8} x_j) \quad \text{Equation (3)}$$

Accordingly, the parity checks can be computed as follows:

$$Q = \Sigma_{j=1}^{8} \alpha_j x_j, \quad \text{Equation (4)}$$

$$R = \Sigma_{j=1}^{8} x_j, \quad \text{Equation (5)}$$

$$P_i = Q + \beta_i R \quad \text{Equation (6)}$$

Therefore, the parity checks obey the following:

$$\frac{P_2 + P_1}{\beta_2 + \beta_1} = \frac{P_3 + P_1}{\beta_3 + \beta_1} \quad \text{Equation (7)}$$

Which can also be written as:

$$(\beta_2 + \beta_3) P_1 + (\beta_1 + \beta_3) P_2 + (\beta_2 + \beta_2) / P_3 = 0 \quad \text{Equation (8)}$$

Accordingly, the recovery module 210, using the known dependencies (e.g., the coefficients) between encoding chunks, can recover two compromised instances even if the same two corresponding data chunks are lost in both instances (as shown in FIG. 6).

Figure 7:
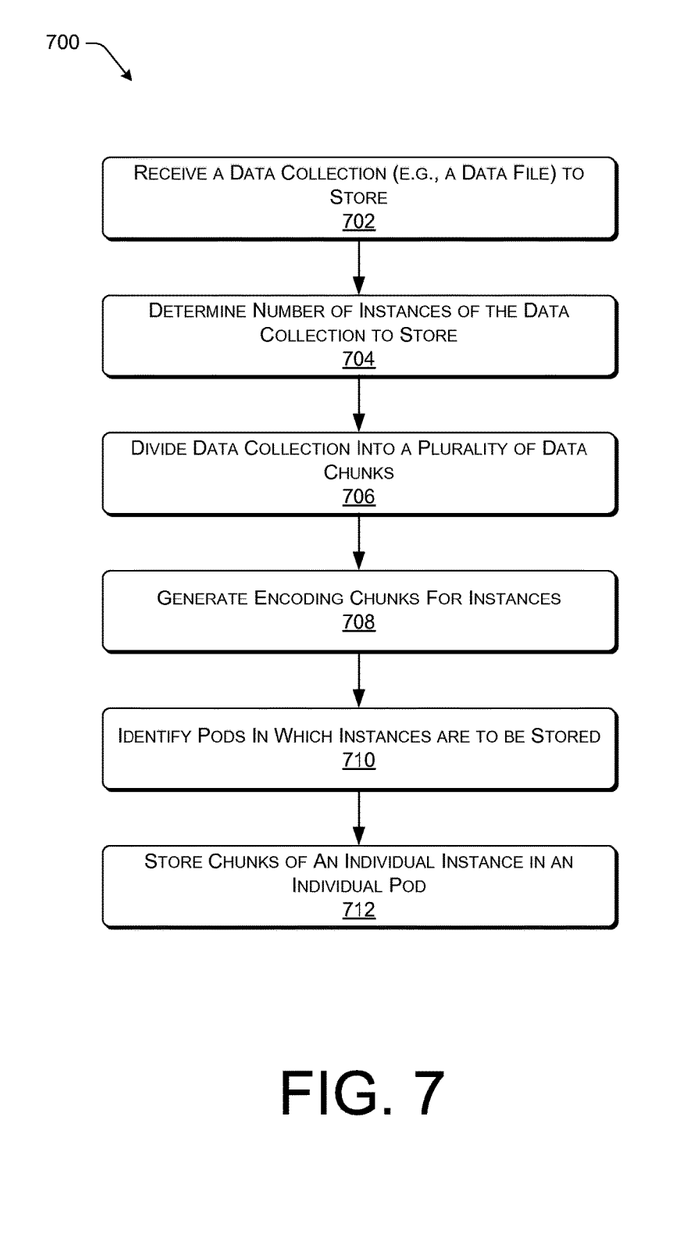
FIG. 7 illustrates an example process that stores multiple instances of a data collection in multiple groups of storage units of a network storage system.
Figure 8:
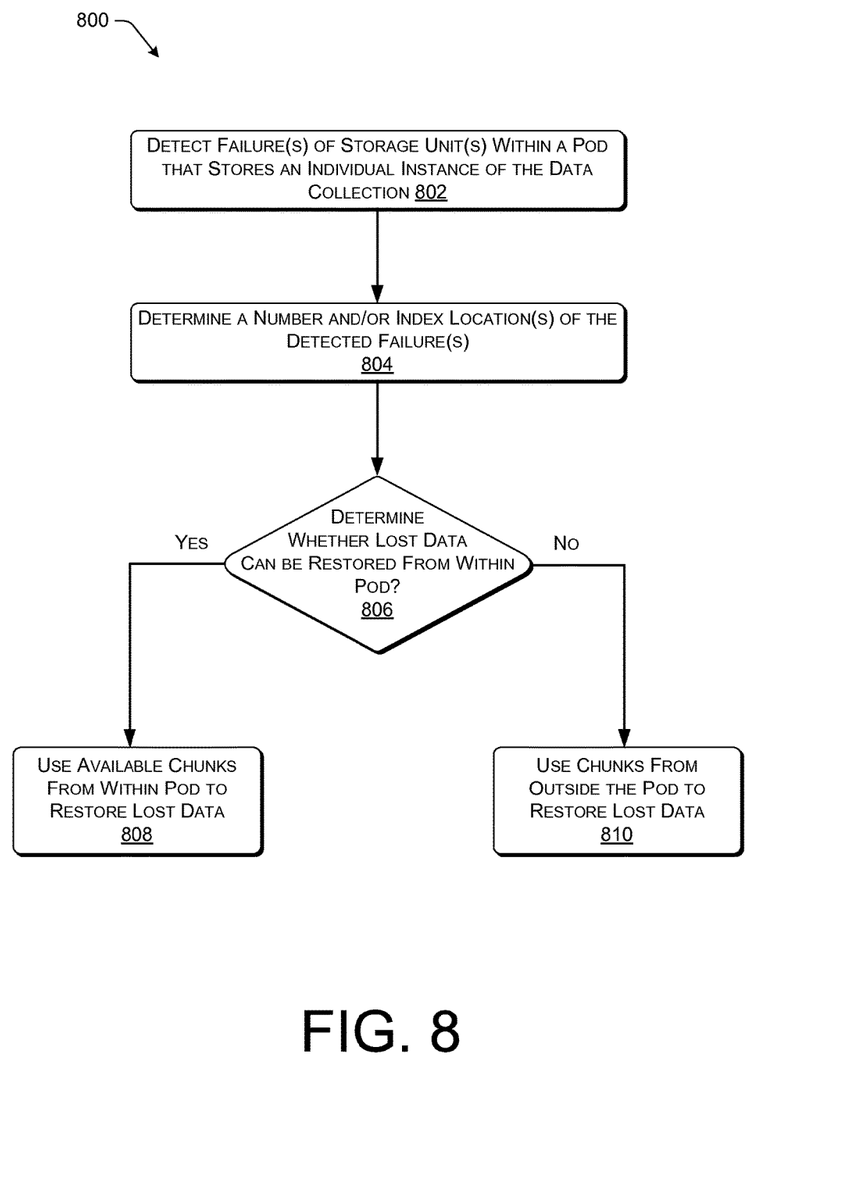
FIG. 8 illustrates an example process that determines whether restoration of lost data occurs using connections within an individual group of storage units or connections outside the individual group of storage units.

FIGS. 7 and 8 individually illustrate an example process for employing the techniques described herein. For ease of illustration, the example processes are described as being performed in the environment 100 of FIG. 1 and/or by the device 200 illustrated in FIG. 2. However, processes can be performed in other environments and by other devices as well. The example processes are illustrated as logical flow graphs, each operation of which represents a sequence of operations that can be implemented in hardware, software, or a combination thereof. In the context of software, the operations represent computer-executable instructions stored on one or more computer-readable storage media that, when executed by one or more processors, configure a device to perform the recited operations. Generally, computer-executable instructions include routines, programs, objects, components, data structures, and the like that perform particular functions. The order in which the operations are described is not intended to be construed as a limitation, and any number of the described operations can be combined in any order and/or in parallel to implement the process. Further, any of the individual operations can be omitted.

FIG. 7 illustrates an example process 700 that stores multiple instances of a data collection in pods of a network storage system.

At 702, a data collection to be stored is received. For example, the data collection can be received from a client device 104.

At 704, a number of instances of the data collection to be stored is determined. For example, the erasure encoding module 208 can consider factors such as type of information and user input to determine a number of instances to store (e.g., two, three, etc.). As discussed, storing three instances instead of two provides increased reliability but also consumes more available storage capacity.

At 706, the data collection is divided into a plurality of data chunks. For example, the erasure encoding module 208 can divide the data collection into a number k of equal sized data chunks.

At 708, an encoding chunk for individual instances of the data collection is generated. As discussed above, the encoding chunks generated for multiple instances of a data collection can be different but can be generated to have known dependencies so that a lost encoding chunk can be re-computed. This increases the reliability of the network storage system 102 storing the data collection. Alternatively, however, the encoding chunks generated for multiple instances of a data collection can be the same.

At 710, pods in which the instances are to be stored are identified. As discussed above, a pod is a group of storage units that have connections with minimized latencies (e.g., little or no latency), that have higher data throughput, and that have faster input/output (I/O) operations so that a data chunk can efficiently be retrieved (e.g., read) by a device 200 of network storage system 102 as part of a data collection reconstruction and/or chunk restoration process. In various implementations, the pod determination module 206 can create and/or determine the pods, prior to receiving the data collection, based on characteristics 212.

At 712, chunks of an individual instance are stored completely within an individual pod. For example, the erasure encoding module 208 stores the respective chunks of an individual instance on a respective storage unit within a pod.

FIG. 8 illustrates an example process 800 that determines whether reconstruction or restoration of lost data occurs using connections within a pod or using connections outside a pod.

At 802, one or more failures of one or more storage units within a pod that stores an individual instance of the data collection are detected. Example failures that occur within a pod are discussed with respect to FIGS. 3-6.

At 804, a number of detected failure(s) and/or locations of the detected failure(s) are determined (e.g., the location can be based on an index).

At decision 806, it is determined whether the lost data can be restored from within the pod. For example, the recovery module 210 can determine whether there is sufficient information (e.g., a sufficient number of other chunks) available within the pod so that the lost data (e.g., a data chunk stored on a failed storage unit) can be restored using connections within a pod. As discussed above, connections within a pod are stronger than connections outside the pod.

If "yes" at 806, then the process proceeds to 808 where available chunks from within the pod are used to restore the lost data. For example, the recovery module 210 can use connections within the pod to read the chunks from the storage units within the pod that have not failed.

If "no" at 806, then the process proceeds to 810 where chunks outside the pod are used to restore the lost data. For example, the recovery module 210 can use connections outside the pod to read chunks from storage units of other pods.

EXAMPLE CLAUSES

Example A, at least one device comprising: one or more processors; memory storing modules that, when executed by the one or more processors, cause the at least one device to: determine a number of instances of a data collection to be stored; divide the data collection into a plurality of erasure coded data chunks to be stored for individual instances of the determined number of instances; for individual instances of the determined number of instances: generate an encoding chunk associated with the plurality of erasure coded data chunks; identify a group of storage units on which to store the plurality of erasure coded data chunks and the encoding chunk, wherein inclusion of an individual storage unit within the group of storage units is based on one or more connection characteristics; and store the plurality of erasure coded data chunks and the encoding chunk within the group of storage units, wherein an individual storage unit within the group of storage units stores an individual erasure coded data chunk or the encoding chunk; detect at least one failed storage unit thereby compromising an instance of the data collection; and determine whether to restore the compromised instance of the data collection: using first connections within the group of storage units that contains the at least one failed storage unit; or using second connections outside the group of storage units that contains the at least one failed storage unit.

Example B, the at least one device of Example A, wherein the at least one failed storage unit comprises a single failed storage unit that stores an erasure coded data chunk, and the compromised instance of the data collection is restored using the first connections within the group of storage units that contains the single failed storage unit by re-generating a lost erasure coded data chunk using other available erasure coded data chunks and the encoding chunk within the compromised instance.

Example C, the at least one device of Example A, wherein the at least one failed storage unit comprises two or more failed storage units that individually store an erasure coded data chunk, and the compromised instance of the data collection is restored using the second connections outside the group of storage units that contains the two or more failed storage units by retrieving two or more erasure coded data chunks from storage units that are part of another group of storage units.

Example D, the at least one device of Example A, wherein the at least one failed storage unit comprises a single failed storage unit that stores the encoding chunk for the compromised instance of the data collection, and the compromised instance of the data collection is restored using the second connections outside the group of storage units that contains the single failed storage unit by re-computing the lost encoding chunk using another encoding chunk retrieved from a storage unit that is part of another group of storage units.

Example E, the at least one device of any one of Examples A through D, wherein the determined number of instances is two or three, and the encoding chunks generated for the two or the three instances are different and are dependent upon one another such that a lost encoding chunk can be re-computed from an available encoding chunk.

Example F, the at least one device of any one of Examples A through E, wherein a first group of storage units associated with a first instance of the data collection is configured within a first data center and a second group of storage units associated with a second instance of the data collection is configured within a second data center that is different than the first data center.

Example G, the at least one device of any one of Examples A through F, wherein the one or more connection characteristics comprise latency associated with individual storage units in the group of storage units.

Example H, the at least one device of Example G, wherein the latency associated with individual storage units in the group of storage units is less than a pre-defined threshold of latency.

Example I, the at least one device of any one of Examples A through H, wherein the one or more connection characteristics comprise data throughput associated with individual storage units in the group of storage units.

Example J, the at least one device of Example I, wherein the data throughput associated with individual storage units in the group of storage units is greater than a pre-defined threshold of data throughput.

While Example A through Example J are described above with respect to a device, it is understood in the context of this document that the content of Example A through Example J may also be implemented via a system, computer storage media, and/or a method.

Example K, a method comprising determining groups of storage units on which to store data, wherein inclusion of an individual storage unit within an individual group of storage units is based on one or more connection characteristics; dividing, by one or more processors, a data collection into a plurality of erasure coded data chunks; for individual instances of the data collection to be stored: generating an encoding chunk associated with the plurality of erasure coded data chunks; and storing the plurality of erasure coded data chunks and the encoding chunk completely within an identified group of storage units, wherein an individual storage unit within the identified group of storage units stores an individual erasure coded data chunk or the encoding chunk.

Example L, the method of Example K, further comprising: detecting at least one failed storage unit thereby compromising an instance of the data collection; and determining whether to restore the compromised instance of the data collection: using first connections within the identified group of storage units that contains the at least one failed storage unit; or using second connections outside the identified group of storage units that contains the at least one failed storage unit.

Example M, the method of Example K or Example L, wherein the one or more connection characteristics indicate that the individual group of storage units is configured to fail together in response to an event.

Example N, the method of Example M, wherein the event comprises a power outage.

Example O, the method of any one of Examples K through N, wherein the one or more connection characteristics indicate that storage units are physically proximate to one another.

Example P, the method of any one of Examples K through O, wherein the one or more connection characteristics comprise: latency associated with individual storage units; and data throughput associated with individual storage units; and input/output (I/O) operations associated with individual storage units.

While Example K through Example P are described above with respect to a method, it is understood in the context of this document that the content of Example K through Example P may also be implemented via a system, computer storage media, and/or a device.

Example Q, a system comprising: one or more processors; memory storing modules that, when executed by the one or more processors, cause the system to perform operations comprising: determining groups of storage units on which to store data, wherein inclusion of an individual storage unit within an individual group of storage units is based on one or more connection characteristics; dividing a data collection into a plurality of erasure coded data chunks; for individual instances of the data collection to be stored: generating an encoding chunk associated with the plurality of erasure coded data chunks; and storing the plurality of erasure coded data chunks and the encoding chunk completely within an identified group of storage units.

Example R, the system of Example Q, wherein the operations further comprise: detecting at least one failed storage unit thereby compromising an instance of the data collection; determining that the identified group of storage units that includes the at least one failed storage unit contains a sufficient amount of available storage units to restore data lost due to the at least one failed storage unit; and using connections within the identified group of storage units to restore the data lost due to the at least one failed storage unit.

Example S, the system of Example Q or Example R, wherein the one or more connection characteristics indicate that the individual group of storage units is configured to fail together in response to a power failure.

Example T, the system of any one of Examples Q through S, wherein the one or more connection characteristics comprise: latency associated with individual storage units; data throughput associated with individual storage units; and input/output (I/O) operations associated with individual storage units.

While Example Q through Example T are described above with respect to a system, it is understood in the context of this document that the content of Example K through Example P may also be implemented via a method, computer storage media, and/or a device.

CONCLUSION

Although the present disclosure may use language that is specific to structural features and/or methodological operations, the disclosure is not limited to the specific features or operations described herein. Rather, the specific features and operations are disclosed as illustrative forms of implementing the disclosure.

What is claimed is:

1. At least one device comprising:
   one or more processors;
   memory storing instructions that, when executed by the one or more processors, cause the at least one device to:
      determine a number of instances of a data collection to be stored;
      divide the data collection into a plurality of erasure coded data chunks to be stored for individual instances of the determined number of instances;
      for individual instances of the determined number of instances:
         generate an encoding chunk associated with the plurality of erasure coded data chunks;
         identify a group of storage units on which to store the plurality of erasure coded data chunks and the encoding chunk, wherein inclusion of an individual storage unit within the group of storage units is based on one or more connection characteristics, wherein the one or more connection characteristics comprise latency associated with individual storage units in the group of storage units; and
         store the plurality of erasure coded data chunks and the encoding chunk within the group of storage units, wherein an individual storage unit within the group of storage units stores an individual erasure coded data chunk or the encoding chunk;
      detect two or more failed storage units that individually store an erasure coded data chunk thereby compromising an instance of the data collection; and
      determine to restore the compromised instance of the data collection using second connections outside a group of storage units that contains the two or more failed storage units by retrieving two or more erasure coded data chunks from storage units that are part of another group of storage units rather than using first connections within the group of storage units that contains the two or more failed storage units.

2. The at least one device of claim 1, wherein the determined number of instances is two or three, and the encoding chunks generated for the two or the three instances are different and are dependent upon one another such that a lost encoding chunk can be re-computed from an available encoding chunk.

3. The at least one device of claim 1, wherein a first group of storage units associated with a first instance of the data collection is configured within a first data center and a second group of storage units associated with a second instance of the data collection is configured within a second data center that is different than the first data center.

4. The at least one device of claim 1, wherein the latency associated with individual storage units in the group of storage units is less than a pre-defined threshold of latency.

5. The at least one device of claim 1, wherein the one or more connection characteristics further comprise data throughput associated with individual storage units in the group of storage units.

6. The at least one device of claim 5, wherein the data throughput associated with individual storage units in the group of storage units is greater than a pre-defined threshold of data throughput.

7. A method comprising:
   determining groups of storage units on which to store data, wherein inclusion of an individual storage unit within an individual group of storage units is based on one or more connection characteristics, wherein the one or more connection characteristics comprise latency associated with individual storage units;

dividing, by one or more processors, a data collection into a plurality of erasure coded data chunks;

for individual instances of the data collection to be stored:
generating an encoding chunk associated with the plurality of erasure coded data chunks; and
storing the plurality of erasure coded data chunks and the encoding chunk completely within an identified group of storage units, wherein an individual storage unit within the identified group of storage units stores an individual erasure coded data chunk or the encoding chunk;

detecting a single failed storage unit that individually stores an encoding chunk thereby compromising an instance of the data collection; and determining to restore the compromised instance of the data collection using connections outside a group of storage units that contains the single failed storage unit by re-computing the encoding chunk of the single failed storage unit using another encoding chunk retrieved from a storage unit that is part of another group of storage units.

8. The method of claim 7, wherein the one or more connection characteristics indicate that the individual group of storage units is configured to fail together in response to an event.

9. The method of claim 8, wherein the event comprises a power outage.

10. The method of claim 7, wherein the one or more connection characteristics indicate that storage units are physically proximate to one another.

11. The method of claim 7, wherein the one or more connection characteristics further comprise:
data throughput associated with individual storage units; and
input/output (I/O) operations associated with individual storage units.

12. A system comprising:
one or more processors;
memory storing instructions that, when executed by the one or more processors, cause the system to perform operations comprising:
determining groups of storage units on which to store data, wherein inclusion of an individual storage unit within an individual group of storage units is based on one or more connection characteristics, wherein the one or more connection characteristics comprise latency associated with individual storage units;
dividing a data collection into a plurality of erasure coded data chunks;
for individual instances of the data collection to be stored:
generating an encoding chunk associated with the plurality of erasure coded data chunks; and
storing the plurality of erasure coded data chunks and the encoding chunk completely within an identified group of storage units;
detecting two or more failed storage units that individually store an erasure coded data chunk thereby compromising an instance of the data collection; and
determining to restore the compromised instance of the data collection using second connections outside a group of storage units that contains the two or more failed storage units by retrieving two or more erasure coded data chunks from storage units that are part of another group of storage units rather than using first connections within the group of storage units that contains the two or more failed storage units.

13. The system of claim 12, wherein the one or more connection characteristics indicate that the individual group of storage units is configured to fail together in response to a power failure.

14. The system of claim 12, wherein the one or more connection characteristics further comprise:
data throughput associated with individual storage units; and
input/output (I/O) operations associated with individual storage units.

15. The at least one device of claim 1, wherein the instructions further cause the at least one device to monitor for the one or more connection characteristics prior to storing the plurality of erasure coded data chunks and the encoding chunk within the group of storage units.

* * * * *